United States Patent [19]

Orloff et al.

[11] 4,426,582

[45] Jan. 17, 1984

[54] CHARGED PARTICLE BEAM APPARATUS AND METHOD UTILIZING LIQUID METAL FIELD IONIZATION SOURCE AND ASYMMETRIC THREE ELEMENT LENS SYSTEM

[75] Inventors: Jonathan H. Orloff, Portland; Lynwood W. Swanson, McMinnville, both of Oreg.

[73] Assignee: Oregon Graduate Center, Beaverton, Oreg.

[21] Appl. No.: 308,125

[22] Filed: Oct. 2, 1981

Related U.S. Application Data

[63] Continuation of Ser. No. 113,806, Jan. 21, 1980, abandoned.

[51] Int. Cl.³ .......................... H01J 31/48; H01J 1/88
[52] U.S. Cl. ............................ 250/396 ML; 250/281; 250/423 R
[58] Field of Search ................ 250/423 F, 281, 398 M

[56] References Cited

U.S. PATENT DOCUMENTS

| | | | |
|---|---|---|---|
| 2,665,384 | 1/1954 | Yockey | 250/396 ML |
| 2,978,580 | 4/1961 | Von Ardenne | 250/288 |
| 3,287,598 | 11/1966 | Brooks | 250/423 R |
| 3,405,263 | 10/1968 | Wanless | 250/281 |
| 4,209,696 | 6/1980 | Fite | 250/288 |
| 4,320,295 | 3/1982 | Eloy | 250/281 |

OTHER PUBLICATIONS

"Electrohydrodynamic Ion Source" by Mahoney et al., J. Applied Physics, vol. 49, No. 13, Dec. 1969, pp. 5101–5106.

Electron Optics and the Electron Microscope by Zworykin et al., Sections 16.6, pp. 571–577, (1946).

Primary Examiner—Harold A. Dixon
Attorney, Agent, or Firm—Cahill, Sutton & Thomas

[57] ABSTRACT

A liquid metal field ionization source is used in conjunction with a three element asymmetric lens system to provide an ion gun having greater magnitude beam currents focused on a smaller spot size than has been previously possible for intermediate energy beams. An ultra-clean emitter surface is achieved by means of an argon sputtering and/or plasma etching process applied to the emitter surface before liquid metal is applied to the emitter surface to ensure uniform and sufficient flow of liquid metal to the apex of the emitter. The three element asymmetric lens system has a very low chromatic aberration coefficient, enabling precise focusing of beams with large energy spreads. For beam accelerating ratios in the range from 0.2 to 6, the ion gun produces very high current densities in beams focused on very small spot areas, despite the relatively large energy spread of beams produced by liquid metal ionization sources. The energy spread of the ion beam is minimized by operating the emitter at a voltage close to the onset voltage and at a temperature close to the melting point of the liquid metal.

8 Claims, 7 Drawing Figures

CHARGED PARTICLE BEAM APPARATUS AND METHOD UTILIZING LIQUID METAL FIELD IONIZATION SOURCE AND ASYMMETRIC THREE ELEMENT LENS SYSTEM

This is a continuation of application Ser. No. 113,806, filed Jan. 21, 1980, now abandoned.

BACKGROUND OF THE INVENTION

1. Field of the Invention

The invention relates to charged particle guns, and more particularly to field electron and ionization sources and ion guns for producing high current, medium energy ion beams and electrostatic lens systems for focusing the beams into small spot areas on a target.

2. Description of the Prior Art

There are numerous applications for ion guns, microprobes and the like capable of producing stable, high current, high resolution ion beams precisely focused onto very small "spot areas" of various targets. Gas phase ionization sources have been utilized, but are presently incapable of providing focused/high current beams of intermediate energy which are needed for certain applications. Liquid metal ionization sources have been experimentally used, but although they are capable of producing much higher currents than gas phase field ionization sources, liquid metal ionization sources have been highly unstable and unreliable due to variations and/or interruptions in their beam currents.

Accordingly, it is an object of the invention to provide a highly reliable liquid metal field ionization source.

Interest in production of submicrometer focused ion beams for various uses has led to a demand for ion guns capable of producing high beam currents and precisely focusing the beam into very small target spot areas. High current beams, especially ion beams, often have large energy spreads. Chromatic aberration of the electrostatic lens systems of ion or electron guns limits the minimum spot size obtainable with an ion or electron gun emitting beam having a high energy spread. Very bright field emission sources, such as thermal field electron emitters, gas phase field ionization emitters, and liquid phase field ionization omitters are capable of producing submicrometer electron or ion beams with tenths to hundreds of nanoamperes of current. However, ion beams produced by liquid metal field ionization sources have been found to have much greater beam energy spreads ($\Delta E$) than gas phase field ionization sources. The wide beam energy spread of beams produced by liquid metal field ionization sources limits the minimum spot size into which an ion beam can be focused by present two-element electrostatic optical lens systems for intermediate beam energies. In order to take advantage of the high level of brightness of such beam sources, it is necessary that their beams be focused by means of electrostatic lenses with low chromatic aberration in order to obtain submicrometer spots sizes. Up to now, no electron guns are capable of providing beam currents as high as 250 nanoampers in submicrometer spot for intermediate beam energies in the range from 2,000 to 30,000 electron volts. In situations typical of lithography or surface analysis, where high currents are desired in focused beam spots of approximately 1,000-2,000 Angstroms, the virtual source size has a relatively small effect on the final beam diameter. This is because the large acceptance angles in the electrostatic lens system necessary for high current result in discs of confusion due to chromatic and spherical aberration of the electrostatic lens system. Such discs of confusion are large compared to the virtual source size. In many cases the contribution of the beam diameter of the virtual source can be ignored and the current and beam spot size are determined by the electrostatic lens system alone.

Accordingly, it is another object of the invention to provide an optical system for focusing an ion beam or electron beam, which optical system is capable of focusing higher beam currents into smaller sized spots than has been previously possible with known field electron emitters, thermal field electron emitters, gas phase ion emitters or liquid metal ion emitters.

It is another object of the invention to provide an ion gun or electron gun capable of producing a large current and having an electrostatic lens system with a low chromatic aberration coefficient.

It is another object of the invention to provide an ion gun capable of focusing a high current intermediate energy beam with a relatively large energy spread onto a very small spot area.

It is another object of the invention to provide a liquid metal field ionization source in combination with an electrostatic optical system capable of focusing a high current beam onto a small spot area.

It is another object of the invention to provide a method of operating an ion gun having a liquid metal field ionization source to provide reliable, uniform beam currents and to minimize energy spread of the ion beam produced by the ion gun.

For many applications, a desirable characteristic of an ion gun is that it have the ability to produce a focused beam with continuous voltage variability while maintaining a fixed image and object distance.

A novelty search directed to the present invention uncovered the following references: U.S. Pat. Nos. 4,088,919; 3,911,311; 4,085,330; 2,809,314; 4,149,055; 4,146,810; 2,233,404; 3,143,680; 3,525,013; 3,551,728; 3,683,287; 3,793,550; 3,911,314; 3,949,230; 4,002,912; 4,032,810; 4,128,764 and 3,631,283 and also the article "A High-intensity Scanning Ion Probe With Submicrometer Spot Size" by Seliger et al, Applied Physics Letters 34(5), Mar. 1, 1979, page 310.

Accordingly, another object of the invention is to provide an ion gun capable of producing and focusing a high current ion beam on a very small spot area and also having the capability of varying the beam energy while maintaining a fixed image and object distance.

SUMMARY OF THE INVENTION

Briefly described, and in accordance with one embodiment thereof, the invention provides a three element, physically asymmetric electrostatic lens system for precisely focusing a beam of charged particles having a relatively large energy spread. In the described embodiment of the invention, an emitter coated with liquid metal is used as a field ionization source. The emitter is aligned in a vacuum chanber with the three element electrostatic lens system. The first and third elements each include an apertured conductive disk which is perpendicular to an axis of the electrostatic lens system. The axis of the lens system passes through the centers of the apertures of the first and third elements. The second element is cylindrical, and is disposed along the axis between and spaced from the first and third elements. The second element has a cylindrical aperture aligned with the axis of the lens system. The cylindrical aperture of the second element includes a first portion having a first diameter and a second portion having a second diameter, the second diameter being approximately six times the first diameter. The dimension of the second portion of the second element along the axis of the lens system is approximately four times as large as the corresponding dimension of the first portion thereof.

The asymmetric configuration of the second element causes the axial potential of a charged particle beam passing through the electrostatic lens system to be gradually reduced with distance along the axis as the beam passes through the second portion of the second element, thereby minimizing chromatic aberration of the electrostatic lens system.

Voltage conductors apply a voltage to the emitter to maintain the emitter at a predetermined level above the onset voltage at which field emission of charged particles begins. These voltage conductors also conduct current through an emitter support to heat the emitter to a predetermined temperature above the melting point of the liquid metal. The predetermined temperature and the predetermined voltage are selected to produce an ion beam with an energy spread less than a preselected value, enabling the electrostatic lens system to focus the ion beam into a predetermined target spot size. The low chromatic aberration of the asymmetric three-element electrostatic lens system permits an ion beam of higher angular intensity, and hence, of substantially higher beam current, to be focused into the predetermined spot size than any prior electrostatic lens system for beam energies in the range from 2,000 to 30,000 electron volts and for beam acceleration ratios in the range from 0.2 to 6.

In the described embodiment of the invention, the emitter is cleaned in a vacuum environment by means of argon sputtering to attain an ultra-pure emitter surface. This enables extremely uniform wetting of the emitter surface by the liquid metal, thereby ensuring continuous flow of liquid metal to the emitter tip during field emission of the beam current, thereby ensuring that the beam current will be reliably constant.

DESCRIPTION OF THE INVENTION

Figure 1:
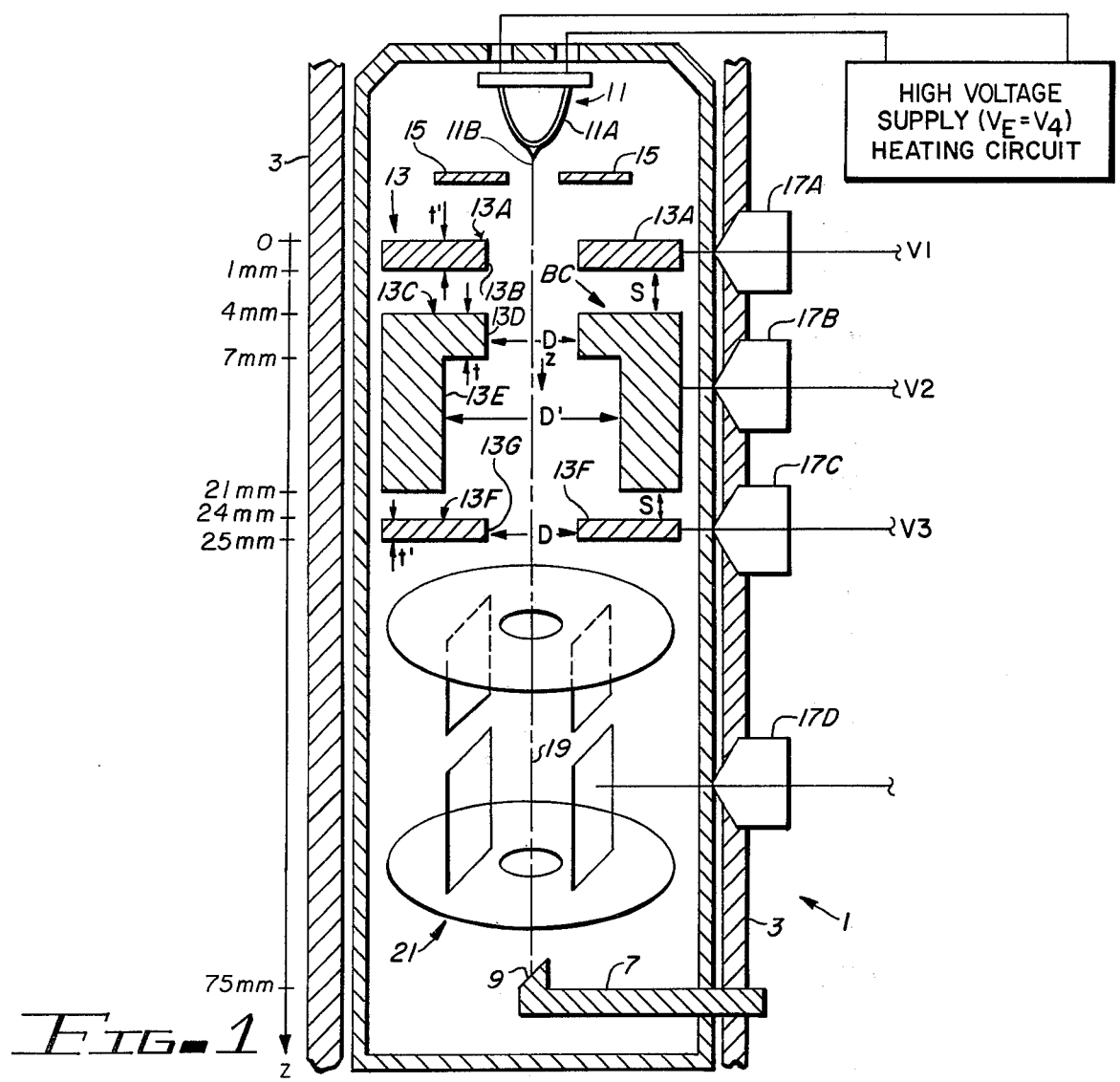
FIG. 1 is a schematic section view of an ion gun including a liquid metal field ionization emitter and a physically asymmetric, voltage asymmetric three element electrostatic optical system.

Referring now to FIG. 1, ion gun 1 includes a liquid metal field ionization source 11 and a physically asymmetric, voltage asymmetric electrostatic optical system 13, a deflection system 21, and a target 9.

Field ionization source 11 includes an emitter support 11A, (which may be made of tungsten) and an emitter 11B. Emitter 11B is coated with liquid metal, such as gallium, which is ionized at the tip of emitter 11B.

In the device of FIG. 1, the tungsten field emitter 11B is fabricated from 127 micron drawn tungsten wire and is spot welded to a 177 micron tungsten loop 11A which is used to resistively heat the emitter.

The conically shaped point of emitter 11B was electrochemically etched, and has a cone half angle of 23 degrees (plus or minus 2 degrees) and a radius of 5 microns (plus or minus 2 microns).

Temperature measurement is accomplished by spot welding 76 micron tungsten leads (not shown) on a section of the filament loop supporting the emitter. Filament resistance is measured and utilized to determine the filament temperature. For more detail, see "Emission Characteristics of a Liquid Gallium Ion Source" L. W. Swanson, G. A. Schwind and A. E. Bell, presented at the Scanning Electron Microscopy Seminar in Washington, D.C., Apr. 16-20, 1979, and published in the proceedings at the seminar in July, 1979. This paper is incorporated herein by reference.

The above described elements are supported within a vacuum chamber 5. Vacuum chamber 5 is supported by support 3. Target 9 is supported on support 7. Support 7 extends through the wall of a vacuum chamber 5 to permit alignment of target 9 with the ion beam emitted from emitter 11B and focused by the asymmetric electrostatic lens system 13. The ion beam is focused generally along dotted line 19 to target 9.

An extractor ring 15 having an opening 15A therein is supported and aligned with emitter 11B immediately below the tip of emitter 11B. Extractor ring is at the same potential as element 13A of electrostatic optical system 13 in the described embodiment of the invention, and can be physically attached to element 13A if desired.

Asymmetric electrostatic lens system 13 includes top element 13A, center element 13C, and bottom element 13F.

A first element 13A is a disk-shaped conductor having a circular aperture 13B. Aperture 13B is centered about axis 19 of ion gun 1, and first element 13A is perpendicular to axis 19. Aperture 13B has a diameter D, which is three millimeters in the described embodiment of the invention. The thickness of first element 13A is designated by t', and is equal to one millimeter.

A second element 13C is physically asymmetric, and is spaced a distance S from first element 13A, S being three millimeters in the described embodiment of the invention. The above mentioned physical asymmetry results from an aperture of varying size through second element 13C. The upper portion 13D of second element 13C has a thickness t and an aperture diameter of D, t being three millimeters. The lower portion 13E of second element 13C has a thickness of 14 millimeters and an aperture diameter of D', which is 18 millimeters in the described embodiment of the invention. The ratio of the aperture diameter D' to the thickness of lower portion 13E therefore is 18 millimeters divided by 14 millimeters, or approximately 1.3.

A third element 13F is parallel to first element 13A, and is spaced S millimeters therefrom. Third element 13F has a thickness t' and an aperture diameter of D. First, second and third elements 13A, 13C and 13F are all axially aligned with respect to axis 19.

In ion gun 1, the distance between the tip of emitter 11B and the plane of the upper surface of top element 13A is 15 millimeters. The distance between the target spot on target 9 and the plane of the upper surface of upper element 13A is 75 millimeters.

It should be noted that the above dimensions of the described embodiment of the invention are exemplary, but not critical. These dimensions were used in devising the curves shown in the various drawings attached hereto, and can be varied by those skilled in the art to produce varying optical characteristics for the electrostatic optical system 13.

Electrostatic deflection system 21 is disposed below third element 13F in FIG. 1 and is axially aligned with axis 19. A voltage $V_E$ is applied to the emitter.

An initial or first voltage V1 is applied to first element 13A by means of feedthrough 17A. Voltage V1 is also applied to extractor ring 15 in the device of FIG. 1. A control voltage V2 is applied to center element 13C by means of feedthrough 17B.

A third or final voltage V3 is applied to bottom element 13F by means of feedthrough 17C. V1, V2 and V3 are all referenced to the voltage $V_E$ of the ionization source 11. In usual configurations, V3 would be set at ground potential and the final energy of the beam would then be determined by $V_E$. The extraction voltage is determined by the difference between $V_E$ and V1.

Feedthrough 17D is employed to apply suitable voltage to the deflection plates of electrostatic deflection system 21.

Before discussing the operation and advantage of the system of FIG. 1, it should be understood that the amount of current in a focused beam is approximately proportional to the square of the angular acceptance $\alpha$ of the lens system. The angular acceptance is the angle which the beam makes with the central axis 19 of the lens system as the emitted beam travels from the virtual source into the first element 13A of the system. The chromatic aberration (which, as mentioned above, is the limiting factor in reducing the spot size into which the beams having large energy spreads can be focused) is proportional to the angular acceptance of the lens system.

Consequently, if the chromatic aberration of the lens system can be reduced, the same spot size can be obtained with an increased angular acceptance. This, of course, greatly increases the beam current which can be focused by the lens system onto the spot (since the beam current is approximately proportional to the square of the angular acceptance).

A novelty search directed to the present invention uncovered the following references, none of which are believed to disclose or suggest the invention described herein: U.S. Pat. Nos. 4,085,330; 3,475,636; 3,233,404; 3,631,283; 3,525,013; 3,911,311; 2,809,314; 4,146,810; 4,032,810; 4,002,912; 3,949,230; 3,143,680; and 3,551,728. The papers by the inventors subsequently incorporated hereby reference give an indication of the state of the art, as do the references cited in the bibliographies of those papers.

In discussing the operation and advantages of the system shown in FIG. 1, the following symbols are used and are defined below:

Symbols List $(dI)/(d\Omega)$: angular intensity (Amperes $sr^{-1}$)
f: focal length (mm)
F: focal position (mm)
$C_s$: spherical aberration coefficient (mm)
$C_c$: chromatic aberration coefficient (mm)
M: magnification
$\alpha$: aperture half angle subtended (radians)
E: field emission voltage (volts)
$\Delta E$: beam energy spread (volts)

The system shown in FIG. 1 combines a physically asymmetric, voltage asymmetric, electrostatic source optical system with a liquid metal ion source. We have found that this system is capable of providing a very high beam current into a smaller spot than any prior microprobe or gun for beam energies in the intermediate range of roughly 1–30 kilovolts and for acceleration ratios of $0.2 \leq (V_3/V_1) \leq 6$. (For purposes of calculation it is convenient to set the emitter voltage $V_E=0$ and the extraction voltage is then equal to V1. In this case, voltage V3, which is set at ground potential in an actual system, is set not equal to zero. Thus, for purposes of calculation the final beam energy is numerically equal to V3.) As subsequently explained, the liquid metal field ionization source is capable of providing a bright, reliable beam having an angular intensity $dI/d\Omega$ of approximately $10^{-4}$ to $10^{-5}$ amperes per steradian. According to the present invention, a substantial portion of this beam current can be focused onto a spot having a diameter of approximately 0.1 microns.

Figure 2A:
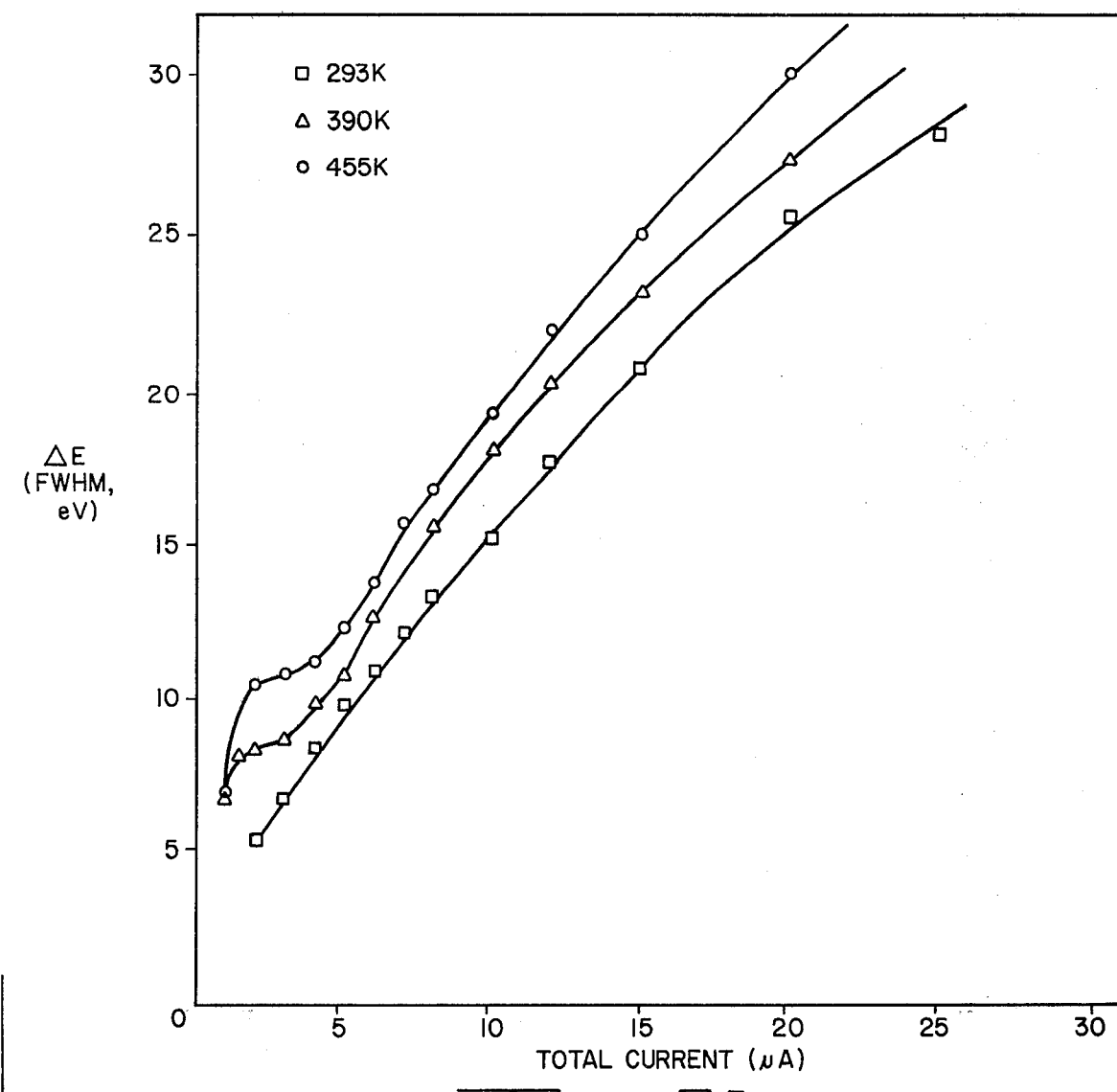
FIG. 2A is a graph showing the variation of ion beam energy spread as a function of total beam current and emitter temperature for a liquid gallium emitter.
Figure 2B:
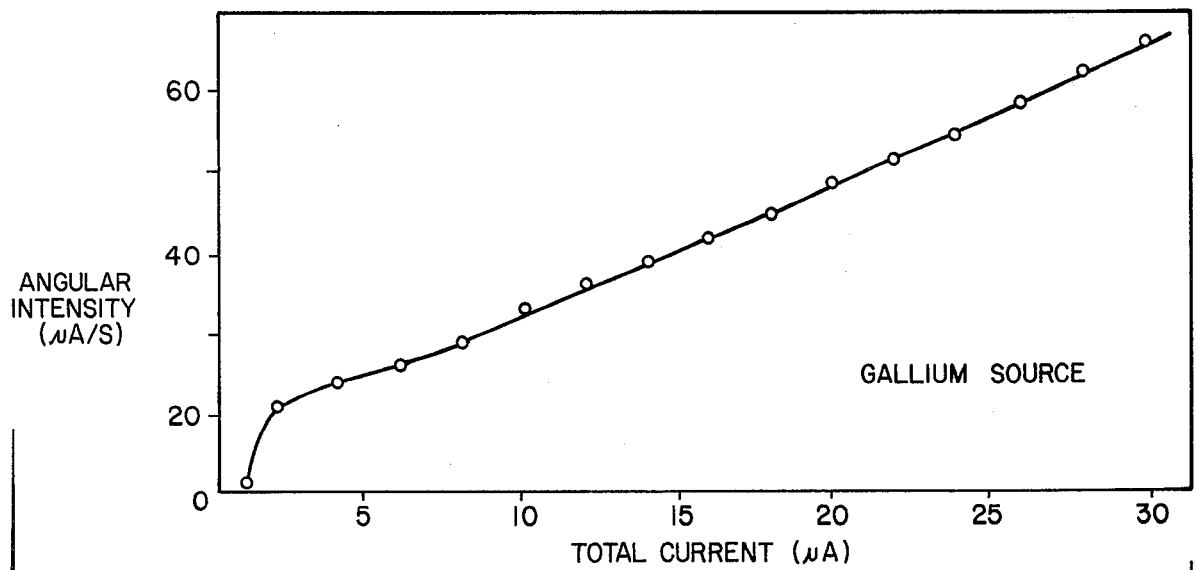
FIG. 2B is a graph showing beam angular intensity as a function of total beam current for liquid gallium emitter.

As previously mentioned, liquid metal field ionization sources frequently have high energy spreads at high beam currents, as shown in FIG. 2B. Therefore, for ion guns with liquid metal field ionization sources, the effect of chromatic aberration of an accelerating or decelerating electrostatic lens system is critical, and is the limiting factor in determining the spot size. Investigations have been made recently on the properties of some extremely bright thermal-field electron (TFE) sources, the results of which show that attention must be paid to the chromatic aberration of the gun as well as to the spherical aberration. Also, with increasing interest in field ionization (FI) sources for the production of submicrometer focused-ion beams, more emphasis must be placed on low-chromatic aberration lenses. Thus, in view of the fact that (1) TFE emitters operated at very high current levels can have an energy spread of $\Delta E$ of 0.5 to 2 eV, and (2) gas phase FI sources exhibit a $\Delta E$ of 1–4 eV and possibly much more with liquid ion sources, lens with low chromatic aberration are of considerable importance.

In accordance with the present invention, we have determined that the physically asymmetric, voltage asymmetric, electrostatic lens system shown in the system of FIG. 1 has lower chromatic aberration than any other known electrostatic lens system operating at comparable voltage ratios.

Two computer programs written by Munro were used to calculate the potential distribution in the optical properties of the lens. The programs were modified slightly in order to be able to run them on a CDC-6400 computer. The first program calculates the axial potential in the lens by means of the finite-element method with boundary conditions determined by the lens geometry. For each calculation the axial potential was plotted to make sure that the parameters chosen to represent the lens did not result in unphysical behavior, such as infinite second derivates of the axial potential. The second program was used to find trajectories and optical properties by integrating the ray equation with the calculated axial potential.

The chromatic aberration $C_c$ of an electrostatic optical system can be calculated in accordance with the following expression:

$$C_c = K \int_{z_o}^{z_i} \left( \frac{1}{2} \frac{V'}{\left(V^{\frac{3}{2}}\right)} \frac{r'}{r} + \frac{1}{4} \frac{V''}{\left(V^{\frac{3}{2}}\right)} \right) r^2 dz$$

In the above expression, V is the axial potential along axis z, and its first and second derivatives with respect to z are V' and V'', respectively. The constant of proportionality K is a function of $V_1$ and M (M is the magnification of the electrostatic lens system). r is the off-axis distance of the beam trajectory. z is axial distance along the axis 19 of the lens system. Primes denote differentation with respect to the axial distance z.

We have shown that for the case wherein the beam emanates from a point source near the focal point of the lens, the slope of trajectory (r') will be greatest and r will be least at the entrance of the lens. We have found that r will be greatest and r' least for the exit end of the lens.

In order to minimize the chromatic aberration $C_c$, it is necessary to maintain V'' at as small a value as possible toward the exit side of the lens and to confine the region where r' is large. However, it is also desirable to have a large value for V' at the lens entrance in order to minimize spherical aberration.

We have found that utilizing small values of r near the lens entrance and a relatively short distance over which V' and r' are large prevents the chromatic aberration $C_c$ from becoming too large. We have found that when the electrostatic lens system of FIG. 1 is operated in the "acceleration" mode, the axial potential V decreases gradually with axial distance after achieving its maximum value near the front of the lens. This behavior is desirable to minimize chromatic aberration.

Figure 6:
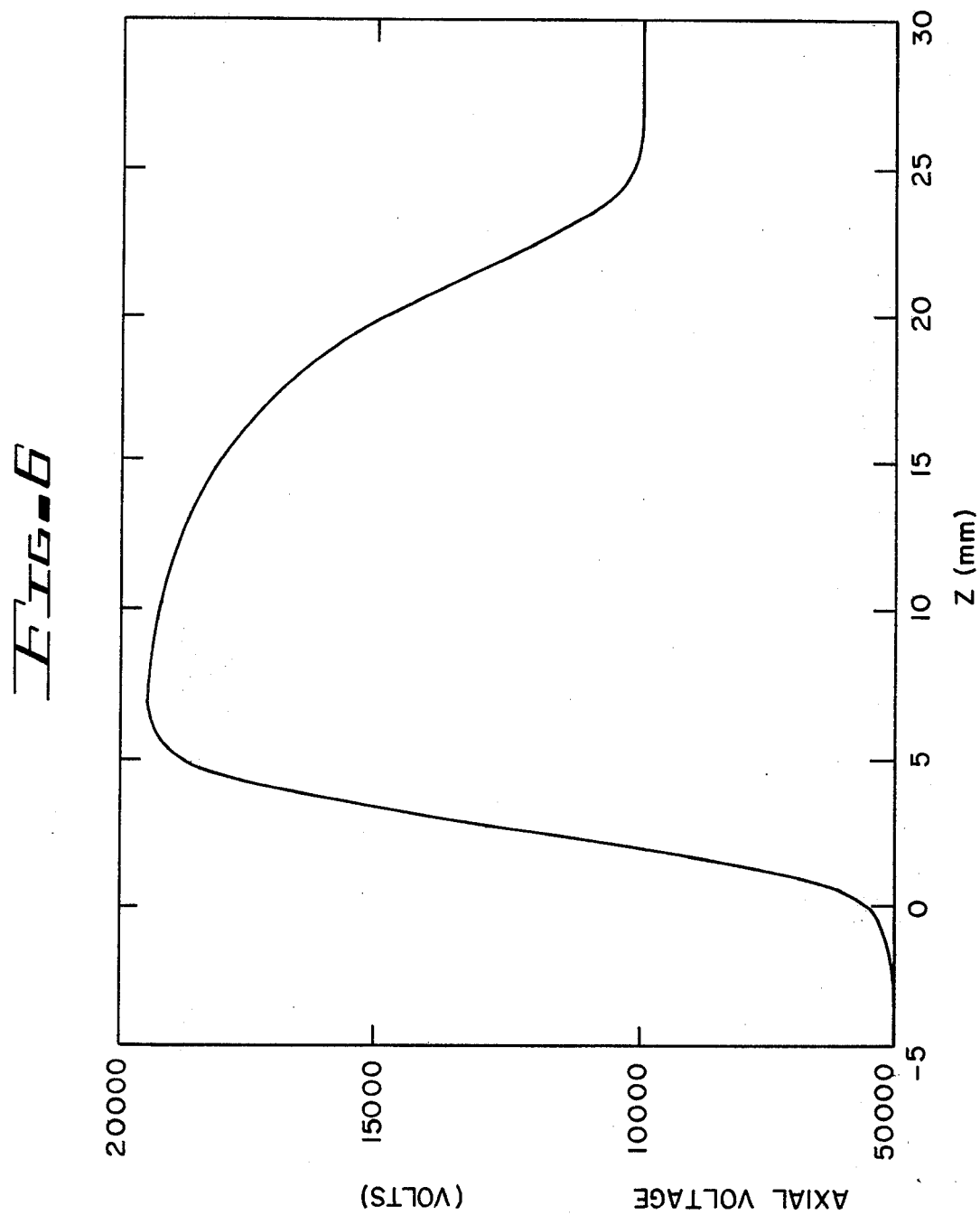
FIG. 6 shows a curve of the axial beam voltage V for the electrostatic optical system of FIG. 1.

In the infinite magnification case (collimated beam), we have found that the axial potential for the above described lens system rises rapidly at the front of the lens and falls at an approximately constant rate towards the rear of the lens (as shown in the plot of FIG. 6 of our previously published paper "A Study of Some Electrostatic Gun Lenses for Field Emission" and FIG. 11(a) of our previously published paper "An Asymmetric Electrostatic Lens for Field Emission Microprobe Applications"). This is due to the small aperture diameter D at the front end of the lens and the large aperture diameter D' on the axis at the rear end of the lens. FIG. 6, which is a graph of the axial potential V of the lens system of FIG. 6, shows the above-mentioned approximately constant rate of decrease of V (and hence, the small value of the second derivative V'') towards the exit side of the lens.

Our calculations show that when it is desirable to work with a relatively low energy beam, the asymmetric three-element lens system has a very substantial advantage over prior two-element lens systems. We have found that for beam accelerating ratios and from approximately 0.2 to 6 the asymmetric voltage, asymmetric electrostatic lens system, due to its low chromatic aberation, is more useful in focusing beam sources with large beam energy spreads at intermediate beam energies in the range from 1-30 kilovolts than any prior electrostatic lens system.

Figure 4:
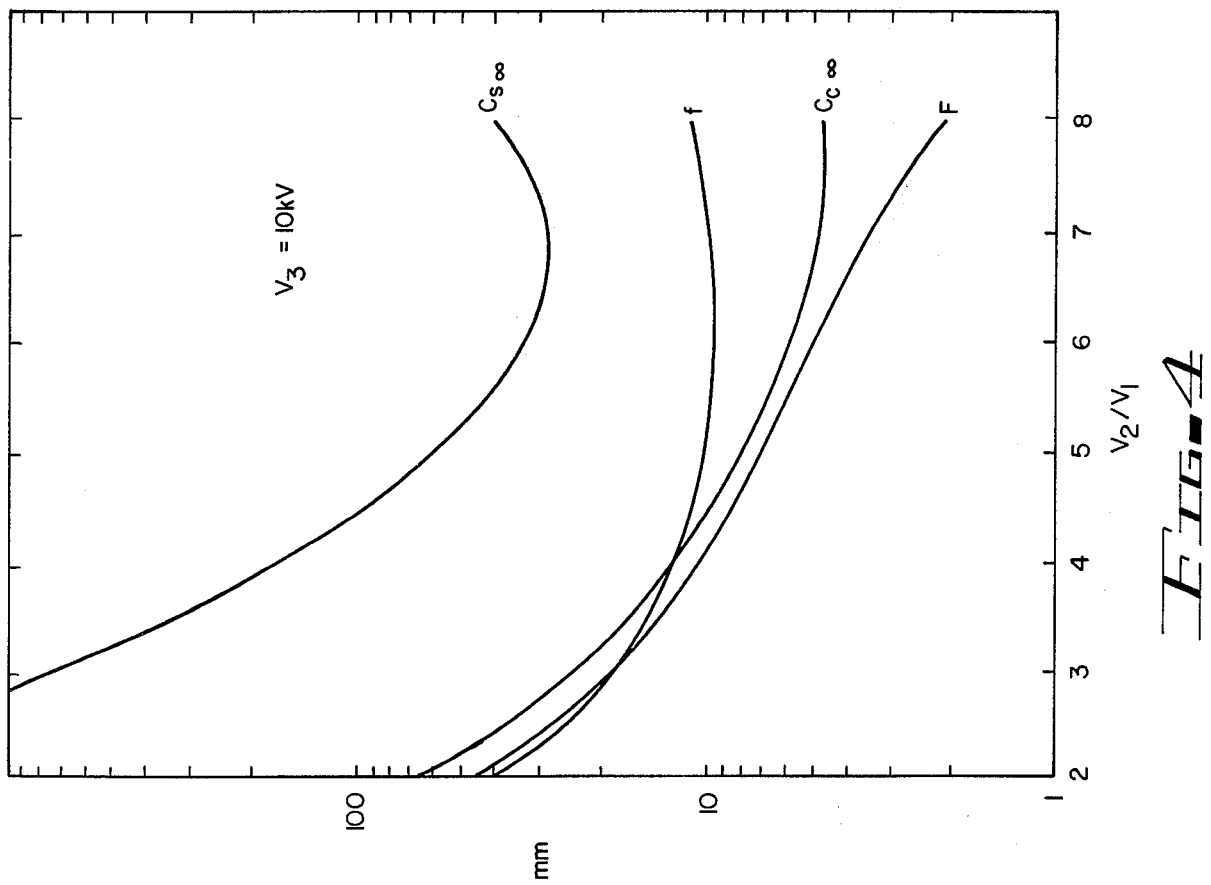
FIG. 4 shows a set of curves showing characteristics of the electrostatic optical system of FIG. 1.

FIG. 4 shows a plot of computed values of the spherical aberration coefficient $C_s$, chromatic aberration coefficient $C_c$, focal length f, and focal position F for the three-element asymmetrical lens system of FIG. 1 as a function of focus voltage ratio $V_2/V_1$ for the case $V_1 = 5$ kV and $V_3 = 10$ kV.

For further detail, see out paper "An Asymmetric Electrostatic lens for Field Emission Microprobe Applications", Journal of Applied Physics, Vol. 50, April, 1979, and "A Study of Some Electrostatic Gun Lenses for Field Emission", presented at the "Scanning Electron Microscopy" Seminar, Apr. 16-18, 1979, and published in the proceedings of that seminar in July, 1979. Both of these papers are incorporated herein by reference. The text of the above-mentioned publication from the Journal of Applied Physics is copied in its entirety at the end of this specification.

Figure 5:
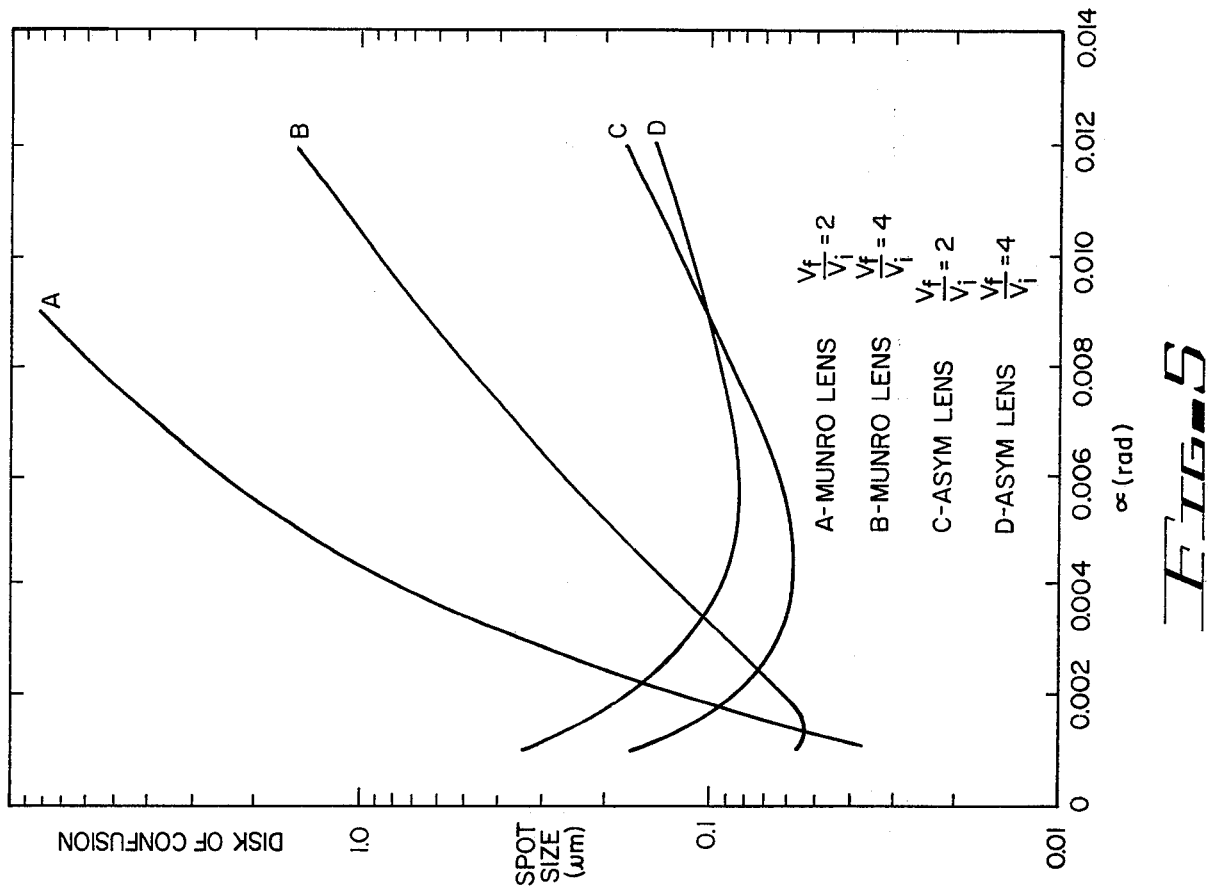
FIG. 5 shows a set of curves useful in comparing a two element electrostatic optical system and the three element asymmetric electrostatic optical system of FIG. 1 for a particular intermediate beam energy.

The superiority of the asymmetric three-element lens system is a conventional two-element lens system as shown in FIG. 5, which shows spot size plotted against angular acceptance and for various acceleration ratios for both types of lens systems.

It has been found that liquid metal field ionization sources have a narrow range of potential over which they can be successfully operated. As the voltage of a liquid metal ion source emitter is increased, the onset of ionization begins at a voltage called the "onset voltage". The valve of the onset voltage depends upon the concise configuration of the emitter tip, and generally will be lower for sharper pointed emitter tips. If the emitter is raised above the onset voltage to increase the magnitude and stability of the beam current, the energy spread ($\Delta E$) of the ion beam increases very rapidly. As mentioned previously, this greatly increases the deleterious effect of chromatic aberration of the electrostatic optical lens system utilized to focus the beam, limiting the smallness of spot size that can be attained.

In accordance with the present invention, the liquid metal ion source is maintained at a voltage only slightly (roughly 10 to 20 volts) above the onset voltage. It is therefore necessary to utilize accelerating or decelerating electrostatic lens systems in order to obtain a different beam energy, which may be required for a particular purpose.

The physically asymmetric, voltage asymmetric lens system of FIG. 1 has proven to be exceptionally suitable for multiplying or dividing the initial beam energy by small factors, in the range from roughly 0.2 to 6.

It has been found that the energy spread of the emitted ion beam is minimum if the emitter is operated at as low a temperature as is possible. The curves in FIG. 2A show the variation of beam energy spread $\Delta E$ with total beam current and temperature.

In accordance with the present invention, the system of FIG. 1 is operated at a temperature in the range from approximately 1 to 10 degrees Centigrade at above the melting point of liquid gallium on other metal metal to be ionized.

As explained above, previous liquid metal field ionization ion sources have been unreliable, as they produce intermittent beam currents. We have found that in order to overcome this problem, it is necessary to attain an extremely high degree of cleanliness of the emitter surface. This enables the liquid metal to attain very intimate, uniform wetting of the material of the emitter shank and tip. Unless this is done, surface tension of the liquid metal prevent the liquid metal from passing by capillary action along the surface of the field emitter around regions of the field emitter which are not adequately "wetted" by the liquid metal. This causes the supply of liquid metal at the tip of the emitter to be exhausted, interrupting or reducing the ionization current. We have found that if the emitter is not well coated, ie. well "wetted", by the liquid gallium, a "pulse" mode of emission frequently occurs if the system of FIG. 1 is operated near the onset voltage. This is apparently due to insufficient mass flow of liquid gallium to the Taylor cone, leading to oscillations of the Taylor cone. For example, if the emitter voltage is increased to promote flow (by field inducement) along the conical section of the emitter when the shank of the emitter is not well wetted by liquid gallium, the resultant Taylor cone becomes rapidly depleted as the liquid metal is used up in the field ionization process; onset of the pulse mode of emission then occurs.

However, if a perfectly clean, uniformly "wetted" emitter shank surface is attained, surface tension action of the liquid metal causes a capillary type of action which assures continuous flow of liquid metal to the pointed tip of the emitter, especially if a section of drawn tungsten wire having longitudinal grooves along its shank is used to form the emitter, as previously explained with reference to FIG. 1.

In the device of FIG. 1 a simple drawn tungsten field emitter 11B coated with gallium is employed. The supply of ionizable liquid gallium material flows to the tungsten emitter apex on which a Taylor cone forms by means of capillary flow along the one micron grooves in the drawn tungsten emitter shaft. The flow of the liquid gallium along the smooth conical section of the tungsten emitter occurs by means of field inducement. It can be shown by the Poiseuille equation, which assumes laminar flow in the liquid film, that flow rates along the emitter shaft is sufficient to supply the equivalent of several milliamperes of ion current provided a well wetted and continuous film coats both the emitter shaft and shank.

We have found that the above described gallium liquid metal field ionization source, when combined with the above described three-element asymmetric electrostatic lens system, has excellent properties as an ion gun for microprobe applications if the emitter is operated at a low temperature slightly above the melting point of gallium and at a low current and at a voltage slightly above the onset threshhold voltage in order to minimize the beam energy spread.

Figure 3:
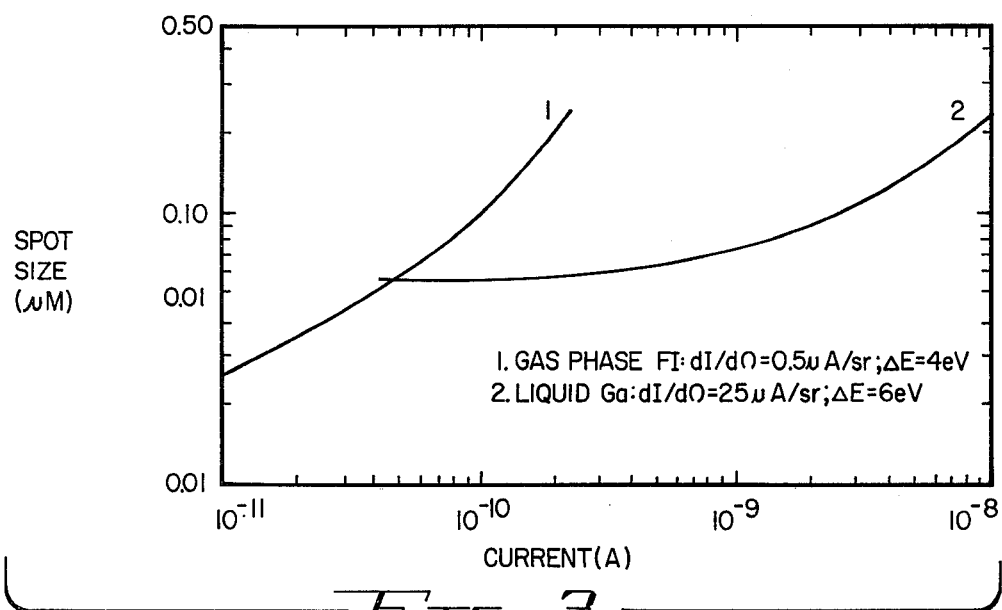
FIG. 3 is a graph useful in comparing gas phase and liquid phase gallium emitters.

It is noteworthy that the three-element lens system can have its control voltage varied without varying the object distance. FIG. 3 illustrates that the liquid gallium ionization source delivers a beam of approximately 30 times the current density of a beam of the same size delivered by a gas phase field ionization source, and a gas phase hydrogen field ionization source.

We have found that a tungsten emitter cleaned in a vacuum system by means of argon sputtering and a gentle plasma etching cleans the emitter surface adequately to attain the necessary detree of intimate "wetting" of the tungsten emitter shank and tip by liquid gallium to ensure uniform, stable beam currents if the emitter is operated at a few degrees Centigrade above the melting point of gallium and roughly ten volts above the onset voltage of the particular emitter.

While the invention has been described with reference to a particular embodiment thereof, those skilled in the art will be able to make numerous obvious modifications to the dislcosed embodiment without departing from the true spirit and scope of the invention. For example, the physically asymmetric lens system 13 of FIG. 1 can be operated in either a voltage symmetric (i.e., as an Einzel lens) or voltage asymmetric mode and obtain very low chromatic aberration for either configuration. The physically asymmetric lens system can be used successfully to focus either intermediate energy electron or ion beams having large energy spreads into narrower target spots than any other known electrostatic optical system. Similar experiments have also been performed with liquid Indium and liquid Bismuth, with results entirely analogous to those described above. It is further expected that a high degree of cleaning of emitters made of other metals and use of other liquid metals as ionization sources will also result in highly stable beams. It is also expected that operation of the emitter at voltages relatively close to the onset voltage will be necessary for other liquid metal sources than gallium in order to keep the beam energy spreads low enough to obtain highly precise focusing. Slight variations in the configuration of the aperture of the second lens element form the configuaration shown in FIG. 1 may be found which will result in small second derivatives ($v''$) of the axial beam potential (V), thereby attaining low chromatic aberration and highly precise beam focusing of beams with large energy spreads. Such configurations are deemed to be within the scope of the invention.

We claim:

1. An apparatus for producing a high current beam of charged particles along an axis and focusing said beam onto a small target spot, said apparatus comprising in combination:
   (a) pointed emitter means for emitting said beam along said axis; said beam having an angular intensity in the range of approximately $10^{-4}$ to $10^{-5}$ amperes per steradian;
   (b) an electrostatic lens system spaced from and disposed about said axis beneath said pointed emitter means for focusing said beam onto said target spot, said electrostatic lens system including
      (i) a first lens element conducting a first voltage and including a first disc having therein a first aperture through which said beam passes, said first aperture being circular and centered about said axis;
      (ii) a second lens element conducting a second voltage and including a second aperture through which said beam passes after it leaves said first aperture, said second lens element being spaced from and disposed beneath said first lens element,
      said second aperture having an upper portion which is circular, and is centered about said axis, and has a first diameter,
      said second aperture having a lower portion which is approximately cylindrical, and is centered about said axis, and has a second diameter, and has a predetermined thickness in the direction of said axis, said second diameter being substantially greater than said first diameter, said second diameter being approximately 1.3 times as great as said predetermined thickness, and (iii) a third lens element located entirely below said second aperture and conducting a third voltage and having a third aperture through which said beam passes only after it leaves said second aperture, said third aperture being circular and centered about said axis, said second lens element producing an approximately constant rate of reduction in the magnitude of the potential along said axis in said lower portion of said second aperture in order to reduce the chromatic aberration caused by said electrostatic lens system.

2. The apparatus of claim 1 wherein the diameter of said first aperture and the diameter of said upper portion of said second aperture are approximately equal in magnitude.

3. The apparatus of claim 2 wherein a thickness of said first lens element, and a thickness of said upper portion of said second aperture, and a spacing between said first and second lens elements are approximately equal in magnitude.

4. The apparatus of claim 1 wherein said pointed emitter means includes a tip coated with liquid metal.

5. The apparatus of claim 1 wherein said beam has an energy spread of at least 0.5 electron volts.

6. The apparatus of claim 1 wherein said first and second discs are flat and parallel to each other and wherein said second lens element has a flat upper surface which is parallel to said first and second discs and wherein said second lens element has a bottom surface which is parallel to said first and second discs.

7. The apparatus of claim 6 wherein the diameter of said first aperture is approximately 3 millimeters, the diameter of said upper portion of said second aperture is approximately 3 millimeters, the diameter of said lower portion of said second aperture is approximately 18 millimeters, said predetermined thickness is approximately 14 millimeters, the spacing between said first disc and said flat upper surface of said second lens element is approximately 3 millimeters, and the spacing between the bottom surface of said second lens element and said second disc is approximately 3 millimeters.

8. A method of producing a high current beam of charged particles and focusing said beam onto a small target spot, said method comprising the steps of:

(a) applying an emitter voltage to a pointed emitter to cause said pointed emitter to emit a beam of charged particles along an axis; said beam having an angular intensity in the range of approximately $10^{-4}$ to $10^{-5}$ amperes per steradian;

(b) passing said beam along said axis through a first aperture disposed in a first lens element after said beam leaves said pointed emitter, said first lens element having a first voltage thereon;

(c) passing said beam along said axis through a first portion of a second aperture disposed in a second lens element, said first portion of said second aperture having a first diameter, said second lens element having a second voltage thereon, and also passing said beam along said axis directly from said first portion of said second aperture into and through a second portion of said second aperture, said second portion of said second aperture having a second diameter that is substantially greater than said first diameter and said second portion of said second aperture extending a predetermined distance along said second axis, said second diameter being approximately 1.3 times as great as said predetermined distance in order to produce an approximately constant rate of reduction in the magnitude of the potential along said axis in said second portion of said second aperture to thereby reduce the chromatic aberration caused by said second lens element;

(d) passing said beam along said axis through a third aperture that is disposed in a third lens element, said third lens element being spaced a predetermined distance from said second portion of said second aperture, said third lens element having a third voltage thereon; and (e) passing said beam along said axis from said third aperture to said target spot.

* * * * *